United States Patent [19]
Myers et al.

[11] Patent Number: 5,566,097
[45] Date of Patent: Oct. 15, 1996

[54] SYSTEM FOR OPTIMAL ELECTRONIC DEBUGGING AND VERIFICATION EMPLOYING SCHEDULED CUTOVER OF ALTERNATIVE LOGIC SIMULATIONS

[75] Inventors: John D. Myers, Endwell, N.Y.; Jose L. Rivero, Boca Raton, Fla.

[73] Assignee: International Business Machines Corporation, Armonk, N.Y.

[21] Appl. No.: 27,016

[22] Filed: Mar. 5, 1993

[51] Int. Cl.⁶ ........................................... G06F 19/00
[52] U.S. Cl. ........................... 364/578; 364/400; 364/402; 395/500
[58] Field of Search ..................... 364/488, 578, 364/400, 401, 402, 488, 570, 578; 371/23, 25.1, 9.1; 395/500, 275, 183.01; 379/15

[56] References Cited

U.S. PATENT DOCUMENTS

| | | | |
|---|---|---|---|
| 3,767,863 | 10/1973 | Borbas et al. | 379/15 |
| 3,812,297 | 5/1974 | Borbas | 371/9.1 |
| 4,590,581 | 5/1986 | Widdoes, Jr. | 364/578 |
| 4,638,451 | 1/1987 | Hester et al. | 395/275 |
| 4,801,870 | 1/1989 | Eichelberger et al. | 371/25.1 |
| 4,872,125 | 10/1989 | Catlin | 364/578 |
| 4,899,273 | 2/1990 | Omoda et al. | 364/200 |
| 4,899,306 | 2/1990 | Greer | 364/900 |
| 4,901,260 | 2/1990 | Lubachevsky | 364/578 |
| 4,937,765 | 6/1990 | Shupe et al. | 364/578 X |
| 5,018,089 | 5/1991 | Kanazawa | 364/578 |
| 5,053,980 | 10/1991 | Kanazawa | 364/578 |
| 5,202,889 | 4/1993 | Aharon et al. | 371/27 |
| 5,208,765 | 5/1993 | Turnbull | 364/552 |
| 5,237,508 | 8/1993 | Furukawa et al. | 364/468 |
| 5,278,750 | 1/1994 | Kaneko et al. | 364/401 |

FOREIGN PATENT DOCUMENTS

| | | |
|---|---|---|
| 0442277A2 | 1/1991 | European Pat. Off. . |
| 3225811 | 1/1984 | Germany ........................ G05B 13/02 |

OTHER PUBLICATIONS

"*Functional Testing Index*" by M. J. Campion et al, IBM Technical Disclosure Bulletin, vol. 23, No. 3, Aug. 1980, p. 985.

*Primary Examiner*—Edward Cosimano
*Attorney, Agent, or Firm*—Baker, Maxham, Jester & Meador

[57] ABSTRACT

A system for determining the optimal circuit design simulator schedule for debugging a digital electronic circuit design. The system characterizes all available circuit design simulators in terms of several parameters reflecting simulator speed and the time required to discover, isolate and fix a design error (bug). A cutover point is established for any pair of available simulators on the basis of these parameters. One simulator is progressively more efficient than the other beyond this cutover point, which is the desired time for scheduling substitution of the more efficient simulator during the debugging process. The system also permits "what-if" evaluation of alternative debugging strategies in advance by creating alternative schedules in response to various characteristic parameters.

8 Claims, 8 Drawing Sheets

Fullscreen CMS                     Lines 1-17 of 53

SIMULATOR PARAMETERS (hrs)

DEBUG  FIND FIX  IMPLEM FIX  SIM 1 MACH CYCLE
SOFTWARE   4.0      0.5        1.0        2.78E-05
HW_SIM    12        1.0       24          1.28E-06
PROTOTYPE 36        1.5       48          2.78E-11
HARDWARE  72       10       4320          3.33E-12

PF3 End  PF4 Quit                            PF8 Forward

Enter your response in vscreen SIMPARM
4B                                     b: Port 21 LU 94

FIG. 5

Fullscreen CMS    Lines 1-17 of 53

DESIRED DISTRIBUTION OF ERRORS

|  | PERCENT | NUMBER | %SERIAL |
|---|---|---|---|
| CHIPLET | 42 | 2562 |  |
| UNIT | 40 | 2440 |  |
| SOFTWARE | 13 | 793 | 40 |
| HW_SIM | 3 | 183 | 10 |
| PROTOTYPE | 0 | 0 | 3 |
| HARDWARE | 2 | 122 | 3 |
| TOTAL | 100 | 6100 |  |

PF3 End  PF4 Quit                PF7 Back    PF8 Forward

Enter your response in vscreen BUGDIST
b: Port 21 LU 94

```
            Fullscreen CMS              Lines 1-17 of 53
+--------------------------------------------------------------+
|                  OPTIMUM CUTOVER POINTS                      |
|                                                              |
|   MACHINE CYC    SIMULATOR      BUGS         WEEKS           |
|                                                              |
|   4.68E+5        SOFTWARE       691          14              |
|   6.75E+7        HW SIM         264          35              |
|   0              PROTOTYPE      0            0               |
|   1.0E9          HARDWARE       142          60              |
|   1.0E9          LAST BUG                                    |
|                                                              |
|   PF3 End  PF4 Quit         PF7 Back    PF8 Forward          |
|                                                              |
|   ↑                                                          |
|                                                              |
|            Enter your response in vscreen CUTOVER            |
+--------------------------------------------------------------+
  4B                                          b: Port 21 LU 94
```

*FIG. 7*

```
                Fullscreen CMS              Lines 1-17 of 53

TIME TO COMPLETION - OPTIMUM DISTRIBUTION

%   BUGS  WEEKS  #SIMU-   HRS/WK TOT MONTH
                                LATORS

SOFTWARE  11  691   14      8        35        3.2
    HW SIM     4  264   35      2       120        8.1
    PROTOTYPE  0    0    0      0       120         —
    HARDWARE   2  142   60      4       120       13.8
                                                  ─────
                                                   25.1

PF3 End  PF4 Quit         PF7 Back    PF8 Forward

Enter your response in vscreen TTCOD
                                  b: Port 21 LU 94
```

*FIG. 8*

```
+--------------------------------------------------------+
|  Fullscreen CMS              Lines 1-17 of 53          |
|                                                        |
|  TIME TO COMPLETION - DESIRED DISTRIBUTION             |
|                                                        |
|       %   BUGS  WEEKS  #SIMU-   HRS/WK TOT MONTH       |
|                        LATORS                          |
|                                                        |
|  SOFTWARE  13  793   29   8      35      6.7           |
|  HW SIM     3  183   38   2     120      8.8           |
|  PROTOTYPE  0    0    0   0     120       —            |
|  HARDWARE   2  122   51   4     120     11.8           |
|                                                       27.3 |
|                                                        |
|  PF3 End  PF4 Quit           PF7 Back                  |
|                                                        |
|                                                        |
|  ←                                                     |
|     Enter your response in vscreen TTCDD               |
|                             b: Port 21 LU 94           |
+--------------------------------------------------------+
```

SYSTEM FOR OPTIMAL ELECTRONIC DEBUGGING AND VERIFICATION EMPLOYING SCHEDULED CUTOVER OF ALTERNATIVE LOGIC SIMULATIONS

BACKGROUND OF THE INVENTION

1. Field of the Invention

This invention relates to systems for the debugging of digital electronic systems and, more specifically, to a system for optimal scheduling of logic simulators used in such debugging.

2. Discussion of the Related Art

In debugging new digital electronic circuit designs, it is common to use circuit simulations to test for errors in the design. Such simulations may be implemented as computer programs running on a general-purpose computer, or as special hardware-software combinations intended for simulating digital systems. The term "simulator" as used herein denominates any of a range of software and hardware assemblies as well as the circuit prototype itself.

Different types of simulators are often used at different stages of the design process. As the design debugging progresses, hardware typically replaces software and mixed hardware-software simulators yield eventually to the design prototype itself. This is necessary because each simulator differs in speed, in available range of identifiable errors, and in ease of modification required to incorporate a design revision or "fix" for a design error or "bug". They also differ in ease of finding a bug because the software simulator provides internal logic signals while the hardware chip is limited to actual inputs and outputs. For example, a software simulator may cycle millions of times more slowly than the equivalent hardware prototype but can be modified merely by editing a file on a computer screen in a few minutes. Fixing the same bug in a full-speed hardware prototype requires refabricating a new version of an integrated circuit, a process that can take weeks. Likewise, two software simulators may differ considerably in cycle speed and range of detectable errors if, for example, one simulates signal timing and the other does not.

In scheduling a debug strategy for a new digital system design, the "cutover" points must be established for moving from a slower, "soft" simulator to a faster, "hard" simulator. This decision may be complicated when the scheduled simulators are shared among several projects.

Although the estimation of the number of bugs (design errors) in a digital circuit design is a well-known procedure that considers the size and complexity of the design, there is no equivalently formal method known in the art for establishing the cutover point from one simulator to the next. The cutover is typically accomplished on an ad hoc basis, determined by the designer's intuition and unrelated production schedules. The release of the design and commitment to hardware prototyping normally results from exhaustion of available test data, "gut-feel" or production schedules arising from marketplace forces.

Thus, the designer has no available formal method for advance scheduling of circuit design simulation resources and cutover points. This is a clearly felt need in the art. The circuit designer is often left without formal grounds for continuing the debug simulation at a certain level when confronted by management imperatives to "push ahead" to hardware prototyping. Without formal means for optimal cutover to prototyping, the first prototype often incorporates more design errors that would otherwise be found after "adequate" debugging in "soft" simulators. This increases costs for everybody concerned, as do unnecessary prototyping delays arising from overcaution.

Practitioners in the art have often proposed systems for improving logic circuit design efficiency. For instance, in U.S. Pat. No. 4,801,870, Edward B. Eichelberger, et al disclose a statistically optimal pattern testing method for quality control of production circuits after completion of debugging. They teach a shortcut to the production circuit one-hundred-percent input pattern testing procedure that employs a weighted random pattern input testing technique. However, Eichelberger, et al neither consider nor suggest methods for optimal cutover from software to hardware simulation during debugging of the initial circuit design. In German Patent DE 32 25 811, Professor Huang, et al disclose a system for predicting the complete performance, timing and regulation of a process configured as a general purpose $n^{th}$ order model. Their system provides a sophisticated modeling technique that may be useful for software simulation and debugging but Huang, et al neither consider nor suggest how to predict the cutover point from software to hardware simulation. Similarly, in U.S. Pat. No. 5,053,980, Kiyoshi Kanazawa discloses a system for increasing the speed of a software logic simulator that relies on introducing a new event identifier technique that avoids the event-driven simulation delays that result from the normal requirement that all events terminate before the simulation clock is incremented. Again, Kanazawa teaches a useful method for software simulation but neither considers nor suggests a formal technique for cutting over from software to hardware simulation during circuit design debugging.

More to the point, M. J. Campion, et al ("Functional Testing Index", IBM Technical Disclosure Bulletin, Vol. 23, No. 3, p. 985, August 1980) briefly suggest a method for formally calculating how much functional testing has already been performed in a simulated data processor design. Campion, et al suggest an "after-the-fact" modeling technique for formally measuring the progress of software simulation but neither consider nor suggest a method for predictively scheduling cutover from software to hardware simulation in a debugging process.

Thus, there is a clearly-felt need for a system that can optimally schedule the cutover or transition between two or more design simulators during debugging in accordance with explicit and fixed (formal) rules. The related unresolved problems and deficiencies are clearly felt in the art and are solved by this invention in the manner described below.

SUMMARY OF THE INVENTION

This invention solves the above problem by applying for the first time an explicit model for the scheduling of available simulators in a digital system debugging process. This method produces and displays a simulation "cutover" schedule based upon selected characteristics identified for each available simulator, including: (a) operating speed; (b) the average time needed to isolate a "bug" identified in the simulation; (c) the average time needed to design and implement a fix for such a bug; (d) an overall estimate of the total number of bugs in the initial design; (e) an estimate of the percentage of all bugs to be found that are "show-stoppers" requiring the simulation and debugging procedure to halt until a fix is implemented; (f) an estimate of the number of cycles of simulation required to identify the "last bug"; and (g) the fraction of weekly time that each simulator is available.

In a preferred aspect, the system of this invention is implemented as a series of steps including:

(1) For each simulator $S_i$, identifying the average fix delay time $D_i$ which is the expected amount of time required, after a bug is discovered, to isolate the bug and to design and implement a fix using that simulator. $D_i$ is determined from the average time $d_i$ required to isolate a bug using simulator $S_i$ (item (b) above), the average time $f_i$ to design and implement a fix using simulator $S_i$ (item (c) above), and the average fraction $s_i$ of bugs found with simulator $S_i$ that are expected to be "show-stoppers" in the sense defined above in item (e).

(2) Calculating the coefficient A that relates the sequential bug number N to the logarithm of the number of simulated machine cycles M needed to find the $N^{th}$ bug, (i.e., A=(ln M)/N) based on an initial estimate N of the total number of bugs in the design (item (d) above) and an initial estimate M of the number of simulated machine cycles needed to find the last bug (item (f) above).

(3) For each pair of simulators, calculating the sequential bug number $n_{ci}$ at which the $i^{th}$ simulator $S_i$ is as efficient as the next simulator $S_{i+1}$, using the average fix delay time $D_i$ from step (1) above, the coefficient A from step (2) above, the amount of simulator time $c_i$ (i=1, 2, . . . ) required to simulate one machine cycle of the design under test (item (a) above), and a derating factor $h_i$ (i=1, 2, . . . ) representing a simulator availability ratio (item (g) above). This is preferably done in two steps. First, the cutover point is found in terms of the number of machine cycles required to reach the next bug number. The second step is to convert this number into a sequential bug number with reference to the coefficient A.

(4) Generating and displaying a simulator schedule that identifies the elapsed debug time at cutover from one simulator to another, based on the sequential bug number $n_{ci}$ and other information determined from the simulations.

It is a purpose of this invention to provide a procedure that identifies and predicts the rate of design error detection ("bug" detection) and design error correction (bug "fix"). It is a further object of the system of this invention that the procedure be adaptable to an unlimited number of logical circuit simulation techniques, ranging from the "softest" (software emulation) to the "hardest" (the prototype circuit itself). For the first time, this invention provides a formal optimization procedure that yields quantifiable results consistently from design to design.

It is an advantage of this invention that formal procedures are provided for scheduling simulator cutover, whereas only intuition and "gut-feel" techniques are available in the art.

It is yet another object of the system of this invention to provide a formal, repeatable procedure that can provide alternative "what-if" analyses based on a set of modified assumptions. It is yet another advantage of the system of this invention that simulation efficiency can be improved during the debugging process by updating the parameters underlying the simulation schedule projection based on new experience.

The foregoing, together with other objects, features and advantages of this invention, will become more apparent when referring to the following specifications, claims and the accompanying drawing.

BRIEF DESCRIPTION OF THE DRAWINGS

For a more complete understanding of this invention, reference is now made to the following detailed description of the embodiments illustrated in the accompanying drawing, wherein.

DETAILED DESCRIPTION OF THE PREFERRED EMBODIMENTS

GLOSSARY

A=exponential coefficient relating bug discovery to number of simulated machine cycles
$c_i$=machine cycle time for $S_i$
$d_i$=average bug isolation time for $S_i$
$D_i$=average fix delay time for $S_i$
$f_i$=average time to design and implement a fix for $S_i$
$h_i$=simulator availability factor=hours per week times number of $i^{th}$ simulators
i=simulator index number=1, 2, 3, . . .
M=M(N)=machine cycles required to discover last bug number N
M(n)=machine cycles required to discover bug number n
N=total number of bugs in original design
n=sequential bug number=1, 2, . . . , N
$n_{ci}$=cutover bug number from simulator $S_i$ to simulator $S_{i+1}$
$S_i$=the $i^{th}$ simulator
$s_i$=fraction of all bugs that are "show-stoppers" in $S_i$ window

THE INVENTION

Figure 3:
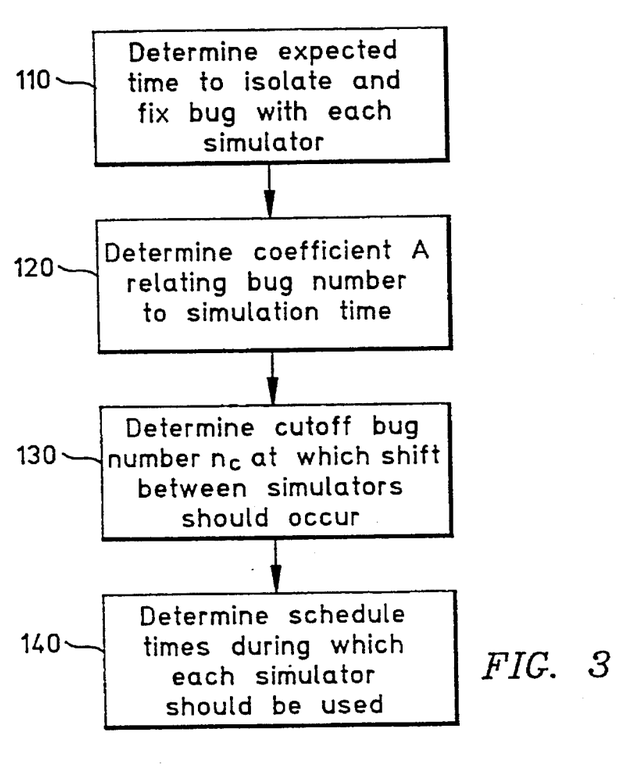
FIG. 3 shows the process flow for determining the optimum cutover times for each simulator.

FIG. 3 shows the process steps involved in determining the optimum times for using each simulator.

Figure 1:
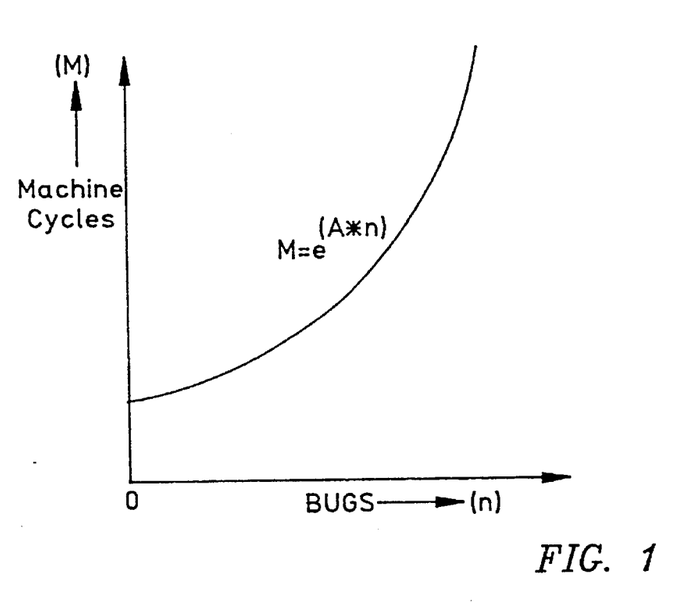
FIG. 1 shows the assumption of the system of this invention relating Bugs and Machine Cycles.
Figure 2:
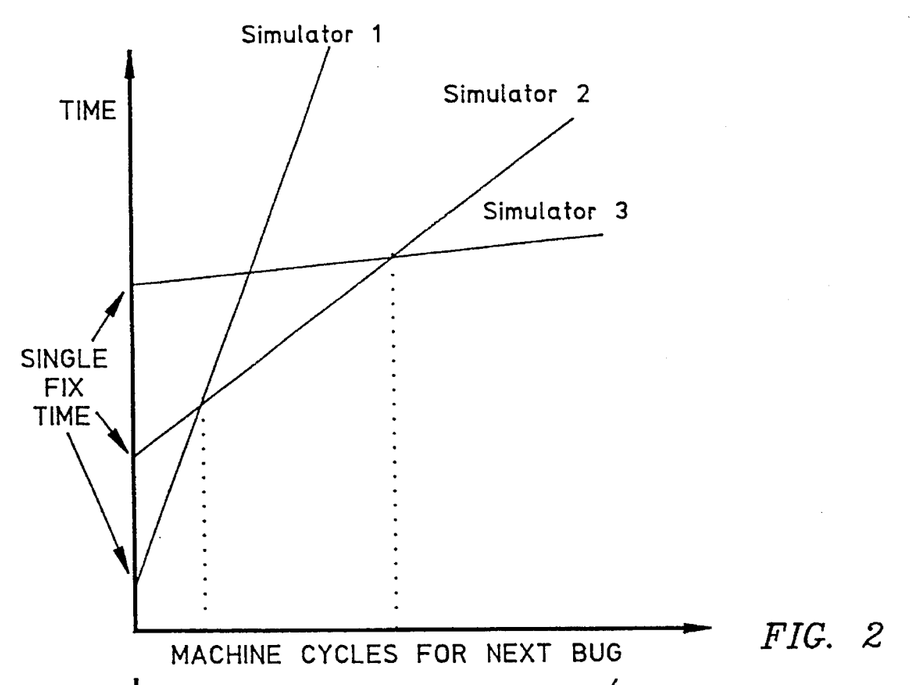
FIG. 2 shows a relationship between Machine Cycles and Time to identify and fix sequential bug number $n_c$ for any pair of different simulators.

In the first step 110 of FIG. 1, the expected time $D_i$ required to isolate and fix each newly discovered bug using simulator $S_i$ is calculated. Typically, a bug is first discovered because the outputs of the simulated digital circuit design do not correspond to what is expected. Each such discovery requires a number of machine cycles M(n) that depends on the sequential discovery or bug number (n). Generally, more machine cycles are needed to uncover the next bug than were necessary to discover the preceding bugs. Once a discrepancy is discovered, the design error that causes the discrepancy must be isolated; a process denominated "isolating the bug". After isolation, design changes required to fix the bug must be determined. The fix must then be implemented by altering the simulator, perhaps by changing a breadboard connection or a software instruction. The accumulated time devoted to these post-discovery activities averaged over all bugs is denominated average fix delay time $D_i$ herein.

The first of these steps, isolating the bug, often requires continuous use of the simulator, whereas the second step can be accomplished "off-line" without interrupting further simulation. In certain cases, however, the bug is a "showstopper" and further simulation work is meaningless until the bug is fixed.

In light of this analysis of how bug-fixing occurs, the expected bug-fixing time $D_i$ is computed in a preferred embodiment of this invention by adding the expected time to isolate the bug to the product of the expected time to implement the bug fix times a factor equal to the expected fraction of bugs that are show-stoppers. This may be expressed as a formula for the $i^{th}$ simulator:

$$D_i = d_i + s_i * f_i$$

where $d_i$=the isolation time, $s_i$=the fraction of show-stoppers among the bugs, $f_i$=the fix implementation time and i=1, 2, . . . .

Continuing now with step 120 of FIG. 3, it is commonly observed that the number of simulated machine cycles required to find a bug is less in the early stages of debugging than in later ones. Empirically, an exponential function such as shown in FIG. 1 was found by the inventors to be a useful approximation of this relationship, so that $M(n)=\exp(A*n)$, where $M(n)$=the simulated machine cycles required to find the $n^{th}$ bug, n=the sequential number of the bug, and A=a coefficient relating to the complexity of the circuit or system design. Procedures are known in the art for fairly estimating these parameters, using the total number of bugs N expected in a system and the number of simulated machine cycles M required to find the "last bug". The user may then easily compute $A=(\ln M)/N$. Other relationships may also prove useful here, such as a polynomial in n or the like.

Figure 4:
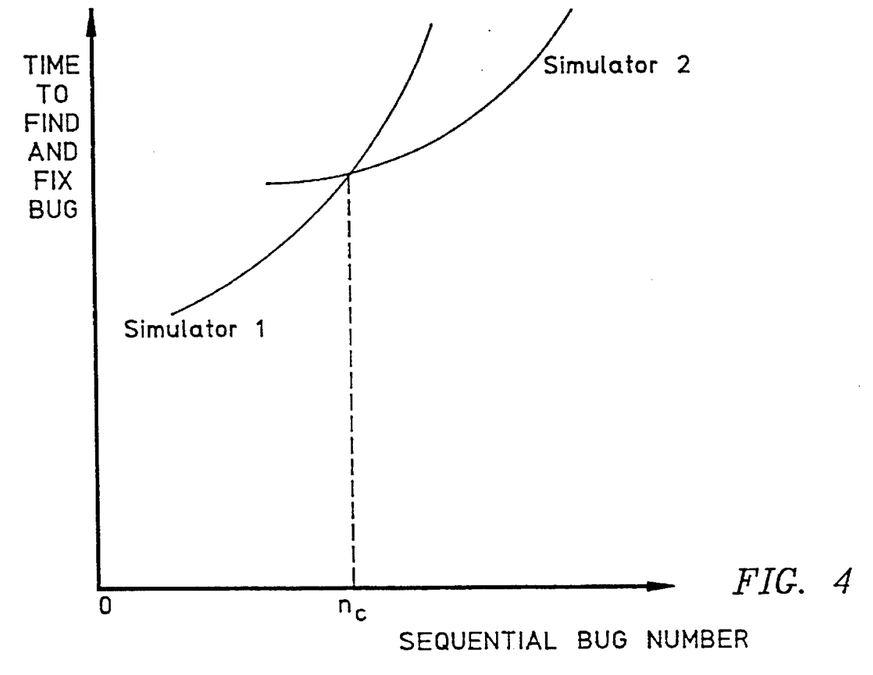
FIG. 4 shows the relationship of bug-fixing time versus sequential bug number for two simulators, the intersection of which conceptually yields the sequential cutover bug number $n_c$.

In step 130 of FIG. 3, the cutover bug number $n_c$ is computed at which a shift is made between simulators. The relationship of the time to find and fix a bug versus sequential bug number for two simulators yields a graph such as shown in FIG. 4. There generally exists a cutover bug number $n_c$ between the two simulators, which is the bug number for which the time to find and fix the next bug is the same for both simulators.

The cutover bug number $n_{ci}$ for an $i^{th}$ pair of simulators $(S_i, S_{i+1})$ may be determined by considering the following relationships. Debug time for a simulator $S_i$ is the sum of the simulation run time to find a bug, $c_i * M(n_{ci})$, and the average fix delay time, $D_i$, where $c_i$=the machine cycle time for the $i^{th}$ simulator. This estimated debug time may be divided by a derating factor $h_i$ reflecting the daily (or weekly) simulator availability, which can be more or less than one full-time simulator ($h_i$=number of $i^{th}$ simulators times average hours per week).

For illustrative purposes, let i=1 so that i+1=2. Equating the debug times for two simulators, $S_1$ and $S_2$, yields the equation at the cutover bug number $n_{c1}$:

$$\frac{D_1 + M(n_{c1})*c_1}{h_1} = \frac{D_2 + M(n_{c1})*c_2}{h_2} \quad \text{[Eqn. 1]}$$

Substituting $M(n_{c1})=\exp(A*n_{c1})$ yields the following equation useful for computing $n_{c1}$:

$$n_{c1} = \frac{1}{A} \ln\left( \frac{D_2*h_1 - D_1*h_2}{c_1*h_2 - c_2*h_1} \right) \quad \text{[Eqn. 2]}$$

Step 140 in FIG. 3 displays the schedule window during which each simulator is to be used. In step 130, the scheduled range of sequential bug numbers for each simulator is determined. To obtain the schedule time for any simulator, the expected times calculated in steps 120 and 130 are summed over all sequential bug numbers scheduled for that simulator.

As an exemplary embodiment of this invention, the inventors developed a simple automated procedure based on these teachings. The embodiment is written in REXX and uses CMS Full Screen as the screen manager. The procedure of this invention may be implemented in any useful manner so long as it implements equations similar to those discussed above.

Figure 5:
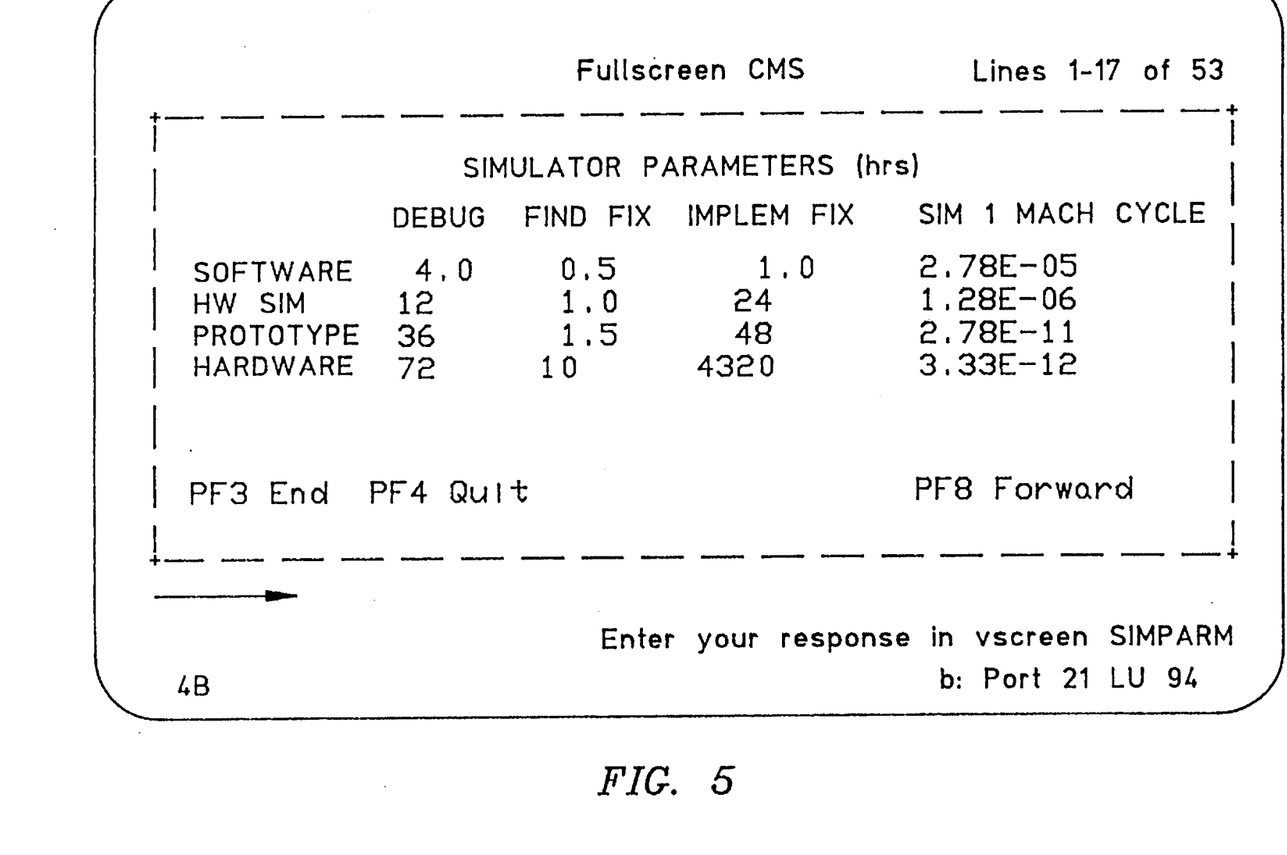
FIG. 5 shows the Simulator Parameters display of an illustrative embodiment of the system of this invention.

FIG. 5 shows the first screen of the exemplary embodiment displaying the simulator parameters. This first screen prompts the user for the performance characteristics of the simulators or hardware to be used during the debugging process. The exemplary embodiment is set up to handle four types of simulators, but can be easily altered to handle more. With less than four types, the user merely provides arbitrary parameters in FIG. 5 and specifies "zero" availability in FIG. 8. The four simulators illustrated in FIG. 5 are, (1) a software simulator, (2) a special-purpose hardware simulation engine, (3) a breadboard prototype version of the hardware and (4) the actual, production hardware.

Figure 6:
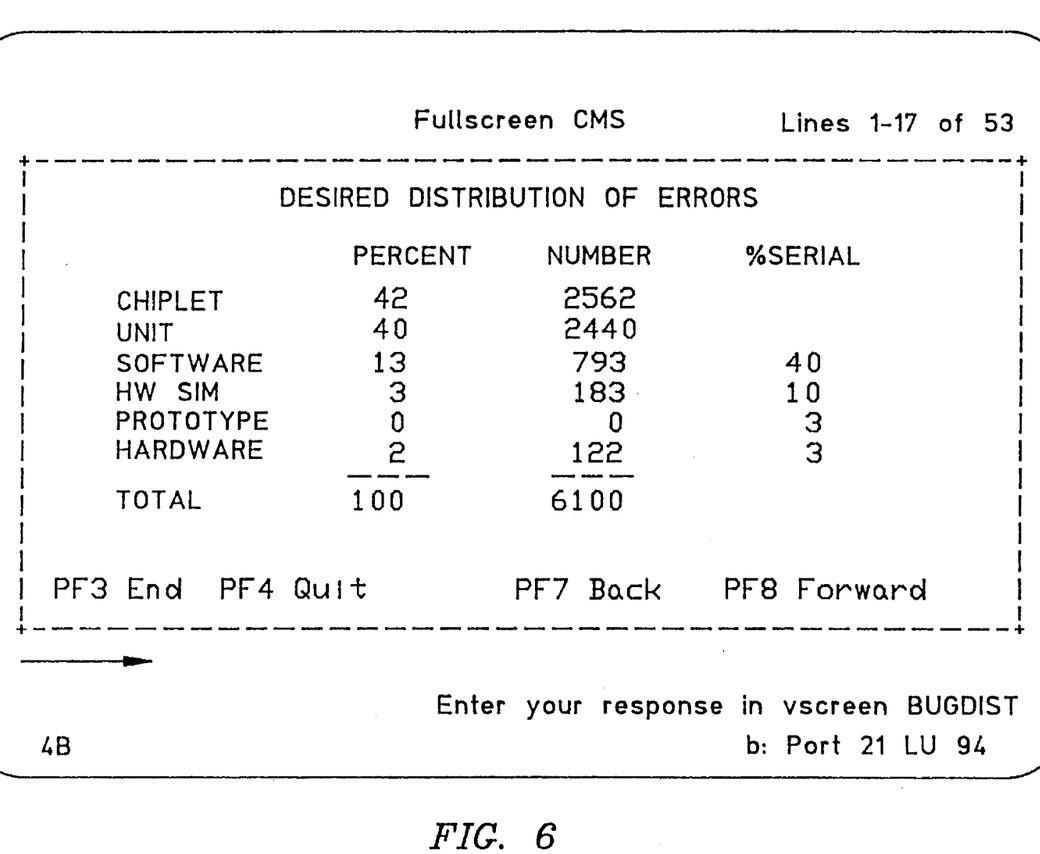
FIG. 6 shows the Desired Distribution of Errors display of an illustrative embodiment of the system of this invention.

FIG. 6 shows the desired distribution of errors provided by the user. This is where the user estimates the number of bugs present in his design (e.g., 6100) and provides a reasonable estimate of where these errors are distributed (the first "percent" column). The exemplary embodiment computes the number of bugs (second column) from the percentages in the first column. The third column (percent serial) is the estimate of the number of "show-stopper" or "serial" bugs.

Figure 7:
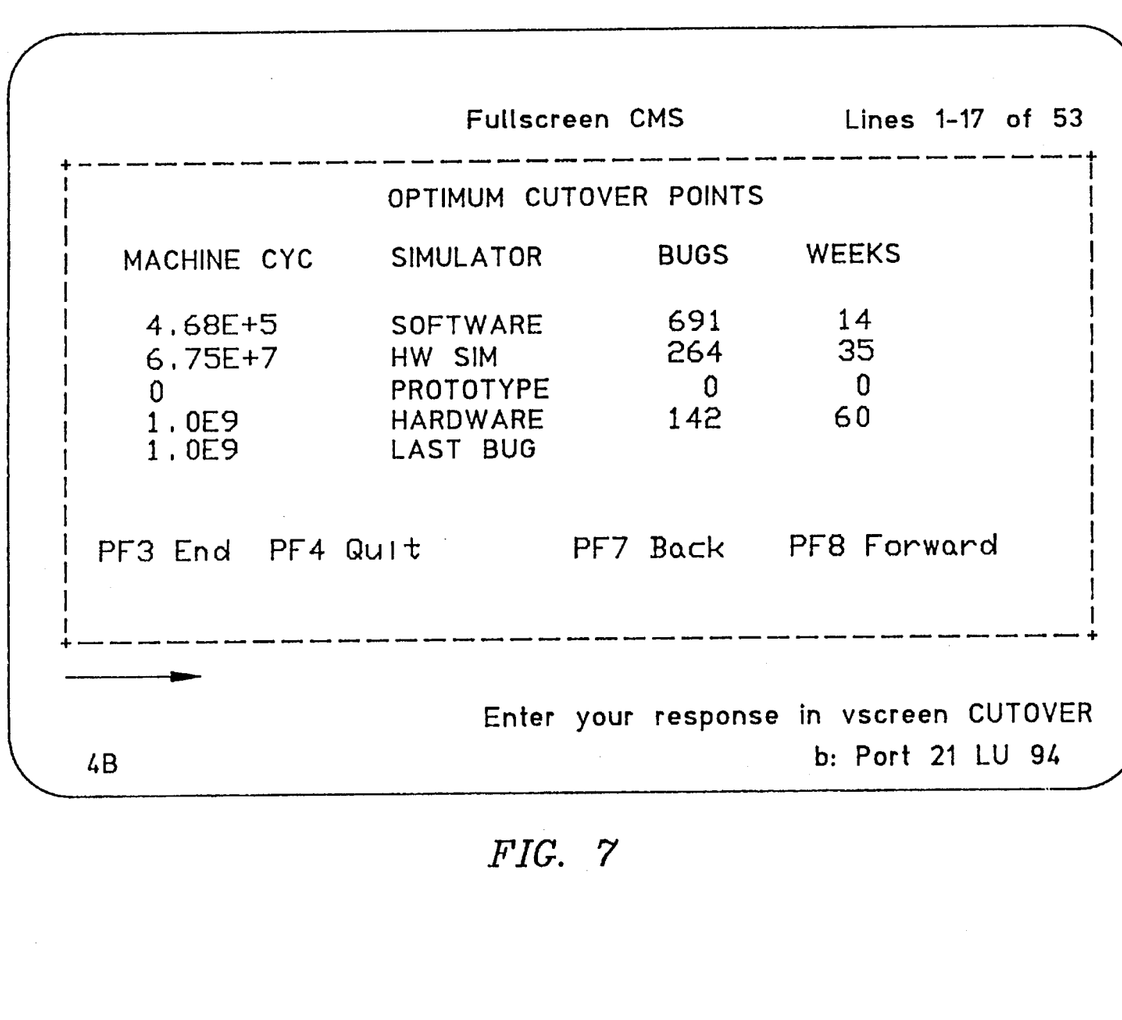
FIG. 7 shows the Optimum Cutover Points display of an illustrative embodiment of the system of this invention.

FIG. 7 shows the optimum cutover points computed from the estimate of the number of machine cycles required to find the "last bug". The exemplary embodiment computes the machine cycles at the cutover points and the number of bugs and schedule time for each simulator as shown.

Figure 8:
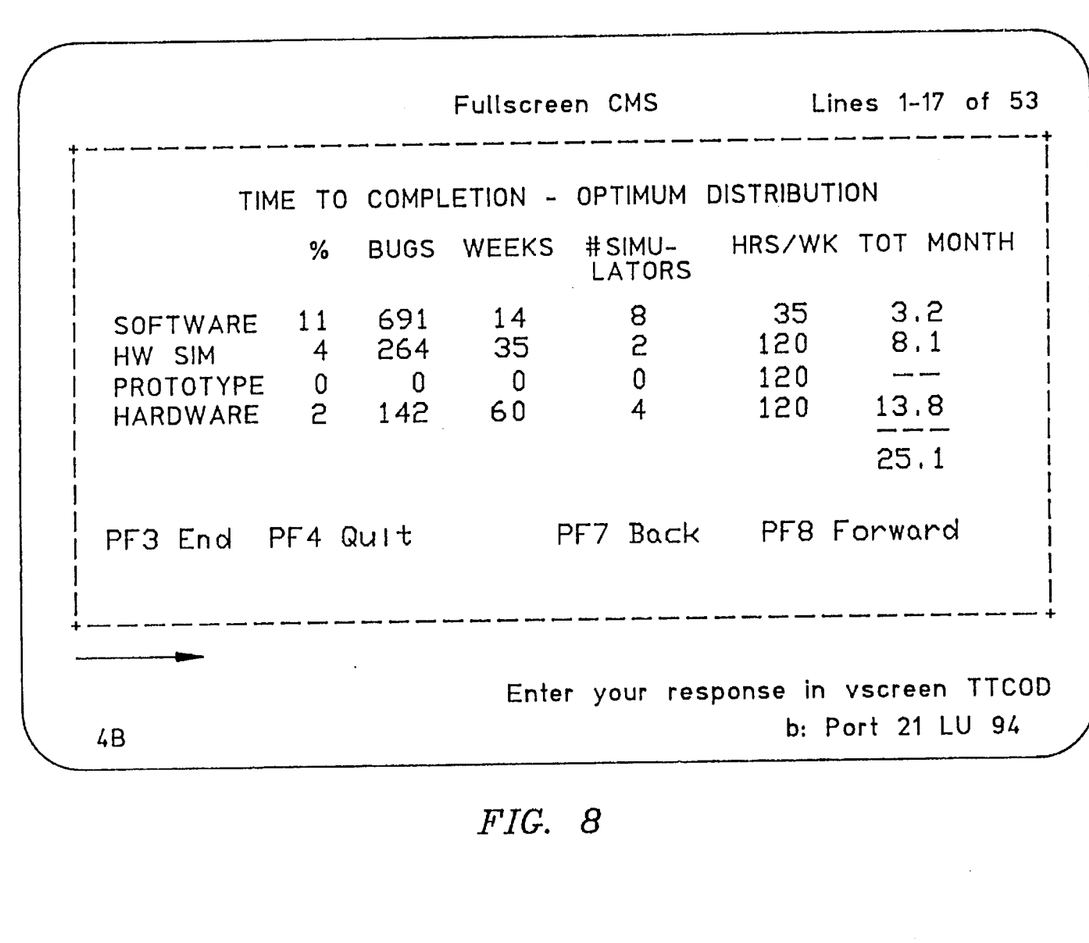
FIG. 8 shows the Time To Completion-Optimum Distribution display of an illustrative embodiment of the system of this invention.

FIG. 8 shows the time to completion and optimum distribution results of the procedure of this invention. The user provides information about the number of available simulators in each of the four categories and the average number of hours per week that each group of simulators is available. The exemplary embodiment then uses this information to recompute the machine cycle count, number of bugs and schedule windows at each cutover point.

Figure 9:
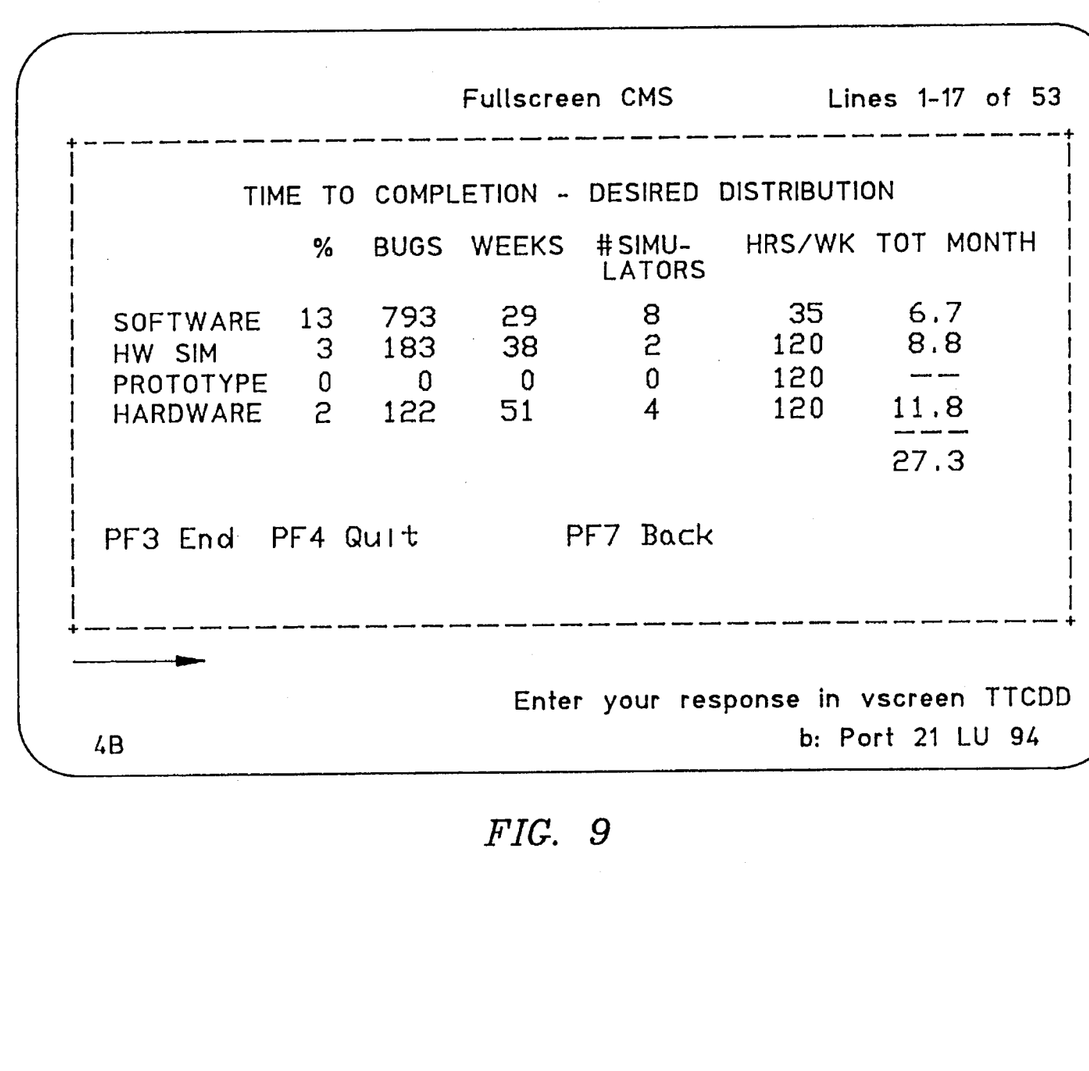
FIG. 9 shows a Time To Completion-Desired Distribution display of an illustrative embodiment of the system of this invention.
Figure 10:
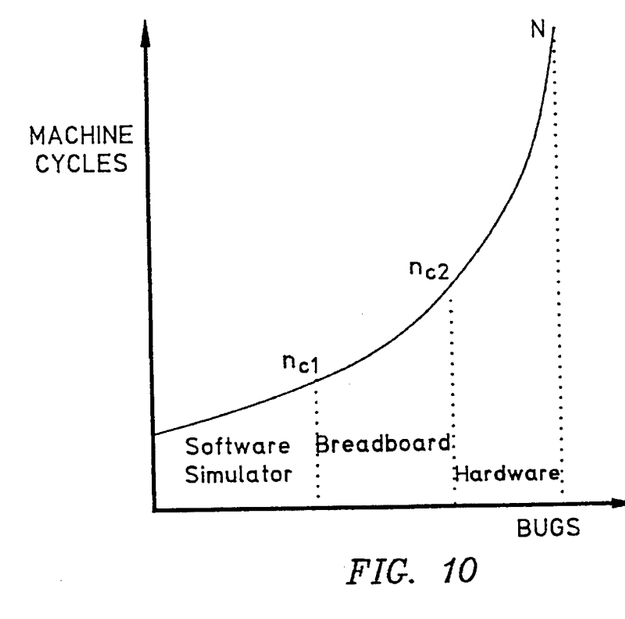
FIG. 10 illustrates the schematic cutover schedule from FIG. 8 in the graphical form introduced in FIG. 1.

FIG. 9 shows the time to completion display. The exemplary embodiment computes the time window for each simulation, assuming that the design errors or bugs are distributed as estimated. This portion of the exemplary embodiment permits the user to force some of the bugs into either simulator adjacent to computed cutover point. For example, because only the hardware simulator can accurately identify technology-dependent bugs, the user may favor it at the expense of theoretical cutover optimization. The user manipulates the entries in the percentage column to instruct the exemplary embodiment.

Figure 11:
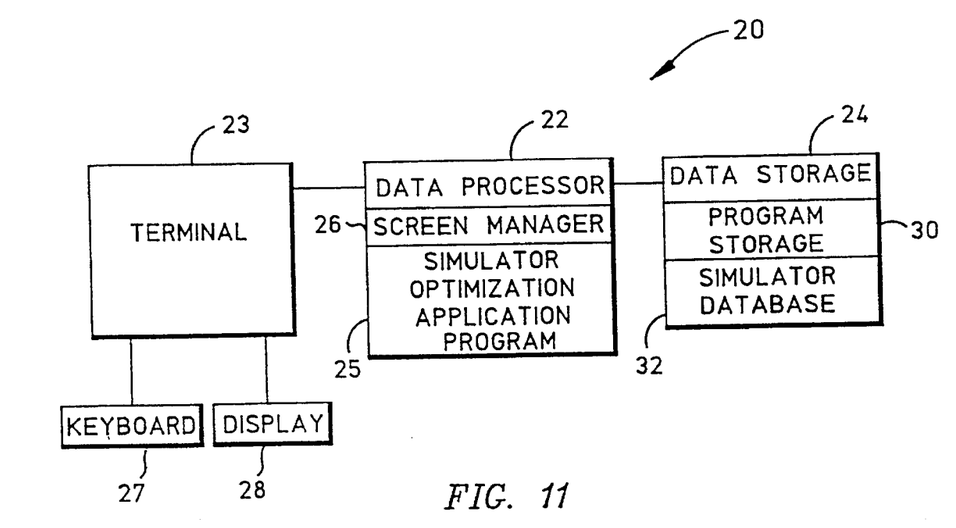
FIG. 11 is a block diagram illustrating a digital computer system in which the invention may be practiced.

FIG. 11 illustrates a digital electronic system 20 in which the invention may be practiced. Preferably, the digital electronic system 20 includes a data processor 22, a terminal 23 and a data storage facility 24. The data processor 22 preferably includes a digital computer of the 3090 type, available from IBM Corporation, which is capable of compiling and executing a simulator optimization application program 25 embodying the process steps described above in connection with FIG. 3. The terminal 23, which is conventionally coupled to the data processor 22, provides a user with the capability of initiating and controlling the execution of the application program 25. Preferably, the data processor 22 also executes a screen manager 26 of the CMS Full Screen type mentioned above. The screen manager 26 interfaces conventionally with a terminal keyboard 27 and a terminal CRT display device 28. The screen manager 26 provides a directly-manipulated, visual interface on the display 28 in the form of the screens illustrated in FIGS. 5–9. The keyboard 27 provides a user with the ability to enter the simulator data described in connection with FIGS. 5–9. These inputs establish parameter values passed to the data processor 22 and used by the application program 25 in the manner described above. The output of the application program 25 which is contained in the screens of FIGS. 5–9 is provided on the display device 28.

The data storage facility 24 is connected to, and conventionally accessed by, the data processor 22. Preferably the data storage facility 24 is provided for storage of programs and data necessary for executing the application program 25. This information is stored in a program storage component 30 of the data storage facility 24. In addition, it is within the contemplated scope of the invention that a simulator database 32 may be provided in the data storage facility 24 and organized on a per-simulator basis for storage of simulator performance characteristics, bug statistics, machine cycle statistics, and simulator operating time statistics. The simulator database 32 can be accessed conventionally through the work station 23 to selectively provide the input parameter values necessary to operate the application program 25.

Manifestly, the terminal 23 could be replaced by a work station, which would execute the screen manager 26. It is also within the scope of the invention to utilize the processing power, interface functions and storage capacity of modern personal, mini, and portable computers to compile and execute the simulator optimization application program. Those skilled in the art will also realize that the application program may be implemented in a dedicated hardware co-processor element included in a simulation processor.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawing.

We claim:

1. A machine-implemented method for scheduling a plurality of circuit design simulators {S} for debugging of a digital electronic circuit design having no more than N bugs that are discoverable in no more than $M(N)=M$ simulated machine cycles of said digital electronic circuit design, where the $n^{th}$ said bug is discoverable in $M(n)$ simulated machine cycles using any one or more of said plurality of circuit design simulators {S}, each two of which form a simulator pair $(S_i, S_{i+1})$, each said simulator $S_i$ having an availability fraction $h_i$, having a machine cycle time $c_i$, having an average fix delay time $D_i$ equal to the mean time between discovery of and the correction of said $n^{th}$ bug for all values of n, and having a debug time for said $n^{th}$ bug equal to the time required to discover and fix said $n^{th}$ bug, wherein i and n are non-zero positive integers, said method comprising the steps of:

(a) estimating the number of said machine cycles $M(n_{ci})$ required to discover a cutover bug number $n_{ci}$ for which said debug times are most nearly equivalent in both of an $i^{th}$ said pair of simulators $(S_i, S_{i+1})$;

(b) estimating a predicted discovery time for said cutover bug number $n_{ci}$ corresponding to the time required to complete said machine cycles $M(n_{ci})$ for one of said simulators in said $i^{th}$ pair of simulators $(S_i, S_{i+1})$;

(c) displaying a debugging simulation schedule for said $i^{th}$ pair of simulators $(S_i, S_{i+1})$ wherein said predicted discovery time for said cutover bug number $n_{ci}$ corresponds to the scheduled time for cutover of said simulated machine cycles from the first said simulator $S_i$ to the second said simulator $S_{i+1}$ of said $i^{th}$ pair of simulators $(S_i, S_{i+1})$; and (d) during simulation of the digital electronic circuit by the first said simulator $S_i$, transitioning said simulation of the digital electronic circuit to the second said simulator $S_{i+1}$ at said scheduled time for cutover.

2. The method of claim 1 wherein said first estimating step (a) further comprises the step of:

(a.1) determining said average fix delay time $D_i$ as substantially equivalent to the sum of the average bug isolation time $d_i$ and the product of the average time $f_i$ to design and implement a fix times the estimated proportion $S_i$ of show-stopping serial bugs such that $D_i=d_i+s_i*f_i$.

3. The method of claim 2 wherein said second estimating step (b) further comprises the step of:

(b.1) estimating said debug time for the $n^{th}$ said bug as substantially equivalent to the sum of the execution time of said number of machine cycles required to discover said $n^{th}$ bug $(c_i*M(n))$ and the average fix delay time $D_i$ divided by said availability fraction $h_i$ such that said debug time equals $$\frac{1}{h_i}(D_i + c_i*M(n)).$$

4. The method of claim 3 wherein said first estimating step (a) further comprises the step of:

(a.2) identifying said cutover bug number $n_{ci}$ as the sequential bug number most nearly equal to the value of the expression $$\frac{1}{A}\ln\left(\frac{D_{i+1}h_i - D_ih_{i+1}}{c_ih_{i+1} - c_{i+1}h_i}\right).$$

5. The method of claim 1 wherein said first estimating step (a) comprises the unordered steps of:

(a.1) calculating an exponential coefficient A in accordance with the formula $A=\ln M/N$; and (a.2) for at least one value of n, calculating said number of machine cycles $M(n)$ required to discover the $n^{th}$ said bug in accordance with the formula $M(n)=e^{A*n}$.

6. The method of claim 5 wherein said first estimating step (a) further comprises the step of:

(a.3) determining said average fix delay time $D_i$ as substantially equivalent to the sum of the average bug isolation time $d_i$ and the product of the average time $f_i$ to design and implement a fix times the estimated proportion $S_i$ of show-stopping serial bugs such that $D_i = d_i + s_i * f_i$.

7. The method of claim 6 wherein said second estimating step (b) further comprises the step of:

(b.1) estimating said debug time for the $n^{th}$ said bug as substantially equivalent to the sum of the execution time of said number of machine cycles required to discover said $n^{th}$ bug ($c_i * M(n)$) and the average fix delay time $D_i$ divided by said availability fraction $h_i$ such that said debug time equals $$\frac{1}{h_i}(D_i + c_i * M(n)).$$

8. The method of claim 7 wherein said first estimating step (a) further comprises the step of:

(a.4) identifying said cutover bug number $n_{ci}$ as the sequential bug number most nearly equal to the value of the expression $$\frac{1}{A} \ln\left(\frac{D_{i+1}h_i - D_i h_{i+1}}{c_i h_{i+1} - c_{i+1} h_i}\right).$$

* * * * *